United States Patent
Dumas

[19]

[11] Patent Number: 6,122,331
[45] Date of Patent: Sep. 19, 2000

[54] DIGITAL AUTOMATIC GAIN CONTROL

[75] Inventor: Jerome Dumas, Chateauneuf les Martigues, France

[73] Assignee: Atmel Corporation, San Jose, Calif.

[21] Appl. No.: 09/332,932

[22] Filed: Jun. 14, 1999

[51] Int. Cl.[7] .................................................. H04L 27/08
[52] U.S. Cl. .................... 375/345; 455/219; 455/235.1; 455/242.1; 455/245.1; 455/247.1
[58] Field of Search ........................... 375/345; 455/219, 455/232.1, 234.1, 234.2, 235.1, 242.1, 246.1, 247.1, 240.1, 245.1

[56] References Cited

U.S. PATENT DOCUMENTS

| | | | |
|---|---|---|---|
| 4,551,688 | 11/1985 | Craiglow | 330/280 |
| 4,792,991 | 12/1988 | Eness | 455/243.1 |
| 4,829,593 | 5/1989 | Hara | 375/345 |
| 5,081,653 | 1/1992 | Saito | 375/345 |
| 5,184,349 | 2/1993 | Riordan | 375/345 |
| 5,301,364 | 4/1994 | Arens et al. | 455/69 |
| 5,321,852 | 6/1994 | Seong | 455/243.1 |
| 5,436,771 | 7/1995 | Yun | 360/65 |
| 5,448,595 | 9/1995 | Kaku et al. | 375/345 |
| 5,563,916 | 10/1996 | Scarpa | 375/345 |
| 5,620,466 | 4/1997 | Haefner et al. | 607/5 |
| 5,627,857 | 5/1997 | Wilson | 375/219 |
| 5,678,214 | 10/1997 | Azuma | 455/235.1 |

*Primary Examiner*—Don Vo
*Attorney, Agent, or Firm*—Thomas Schneck; Rosalio Haro

[57] ABSTRACT

An automatic gain control, AGC, circuit comprising with a preferred transition region. A gain correction unit is responsive to an attenuate command and amplify command coming from a feedback system monitoring the AGC's output. The feedback system can individually adjust the delays of both attenuate and amplify commands sent to the gain correction unit. Additionally, the present AGC also includes a transition region detector that monitors the input signal applied to the AGC to from a feedforward system. The transition region detector producing a control output to selectively permit the gain correction unit to respond to an attenuate or amplify command. If the magnitude of the input signal is greater than a predetermined value, then it will place a disable signal on its control output to prevent the gain correction unit from altering its gain. However, if the magnitude of the input signal remains greater than the predetermined value for a long time, then a timer will override the transition region detector and enable the gain correction unit to adjust its gain.

54 Claims, 7 Drawing Sheets

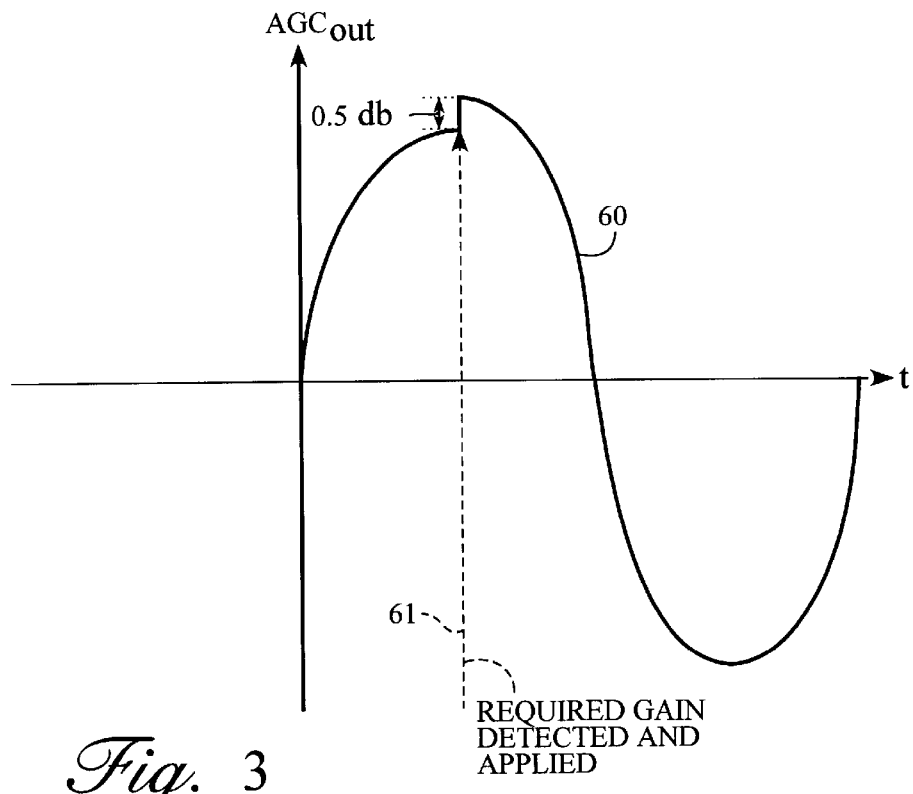
*Fig.* 3
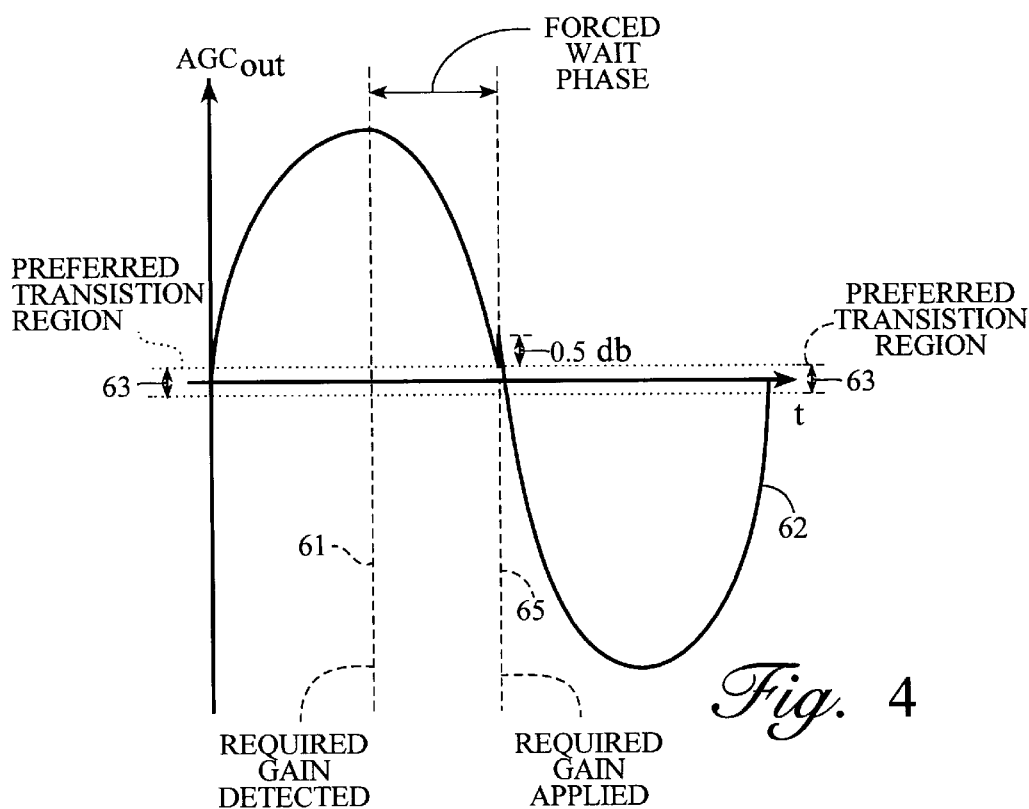
*Fig.* 4

DIGITAL AUTOMATIC GAIN CONTROL

TECHNICAL FIELD

The invention relates to automatic gain control circuits of the type used to adjust the amplitude of an input signal to produce an out having a power level within a predetermined range.

BACKGROUND ART

An automatic gain control, AGC, circuit varies the gain, or amplification, of a receiver so that its output remains at a desired intensity level irrespective of the magnitude of its input. In effect, an AGC produces an output regulated around a desirable threshold to obtain an optimal signal-to-noise ratio that is less dependent on the input signal level.

AGC circuits are routinely used in audio, video and other multimedia applications. For example, multi- channel receivers are typically designed for optimal performance within an ideal input range, but a channel's input strength will likely vary from channel to channel. An AGC inserted between the multi-channel receiver's input and its internal circuitry, will reduce the amount of signal strength variation from channel to channel and provide a more consistent signal strength to the receiver's internal circuitry. AGC circuits are also widely used as audio amplifiers that require their output power to be substantially independent of their input strength. Such audio amplifiers are used, for example, in dictaphones and codecs, which perform better if their audio amplifier's output is not greatly affected by the loudness of the person speaking into their microphone.

Thus, AGC circuits adjust the strength of an incoming signal to assure that it remains within a preferred operating range and thereby produce a more consistent output quality. Typically, AGC circuits do this by limiting the range of an input signal. This is done by reducing the intensity of the highest amplitude segments of an input signal and increasing the intensity of the weaker segments of the input signal. If desired, an AGC may also be used in expansion of an input by emphasizing the high amplitude segments and de-emphasizing the low amplitude segments of an input signal.

A general block diagram of a typical automatic gain control circuit 8 is shown in FIG. 1. An input signal Sin is applied to a gain correction unit 12, which adjusts its gain to amplify or attenuate Sin and produce an output signal Sout within a specified power range. Gain correction unit 12 adjusts its gain in response to a control input, CNTR, produced by a feedback system consisting of evaluation unit 10. Evaluation unit 10 receives both output signal Sout and an input reference threshold voltage. Evaluation unit 10 then compares a measure of Sout's intensity with the reference threshold voltage, and adjusts the gain of correction unit 10 as appropriate to maintain Sout within the intensity level dictated by the threshold voltage.

Evaluation unit 10 typically consists of a rectifier 14, an AC-to-DC converter 16, and a comparator 18. Sout is applied to rectifier 14 to remove negative components and thereby facilitate further processing of Sout. The output of rectifier 14 is applied to AC-to-DC converter 16, which also serves as a constant delay component to establish an "attack time", i.e. a wait period before altering the gain of correction unit 12. AC-to-DC converter 16 obtains a measure of the intensity of Sout by tracking its peak amplitudes, and its "attack time" slows down the response time of AGC 8 in order to reduce oscillation. If gain correction unit 12 were to have an immediate response to changes in Sout, then a slight spike in Sin might cause AGC 8 to continuously increase and decrease the gain of correction unit 12. In addition to the attack time, which is typically set from one to two milliseconds, comparator 18 is given a predetermined amount of hysteresis to further reduce oscillation.

Comparator 18 receives the output of from AC-to-DC converter 16 and also receives the reference threshold voltage. Comparator 18 does not alter the of gain correction unit 12 unless the output from AC-to-DC 16 drifts away from the reference threshold voltage by an amount beyond the comparator's hysteresis level. A typical automatic gain control 8 generally has a 5 dB to 10 dB range above the threshold voltage.

This circuit, however, has some limitations. For one thing, it does not provide much flexibility in establishing the "attack time" for various applications. Additionally, since a typical AGC tracks the intensity of its output signal Sout by monitoring its peak magnitudes, it is still prone to respond to temporary spikes and dips in Sout and degrade its overall output quality in spite of it "attack time" delay and its comparator's hysteresis.

Lastly, AGC 8 may actually reduce the quality of Sout under some circumstances. For example, if Sin experience a sudden increase, or decrease in amplitude while Sout is audible at a speaker output, not shown, then the corrective action of AGC 8 would result in corresponding sudden change in Sout. The sudden change in gain would likely cause a noticeable "clap" at the speaker output. This reduces the sound quality of the overall system.

It is an object of the present invention to provide an AGC that does not have a fixed delay for the application of both an increase gain command and a decrease gain command.

It is another object of the present invention to provide an AGC that is less likely to respond to short spikes in its input signal.

It is a further object of the present invention to provide an AGC that reduces the amount of noticeable clap at its output.

SUMMARY OF THE INVENTION

The above objects are met in an automatic gain control circuit, AGC, capable of not only detecting when a change in its gain is necessary, but also determining an optimal time during which to change the gain.

In prior art AGC's, if an input's instantaneous power were to drop below a predetermined minimum value, the variable amplifier would receive an immediate (or delayed by a constant "attack time") "increase gain" command. Similarly, if the instantaneous power were to rise above a predetermined maximum value, the variable amplifier would receive an immediate (or delayed by a constant "attack time") "decrease gain" command. The present invention deviates from the prior art in that the variable amplifier does not receive an "increase" or "decrease" gain command unless additional criteria are met.

In the present invention, an input signal is applied to a variable amplifier responsive to an "increase gain" command and to a "decrease gain" command. The AGC of the present invention monitors the average power of a rectified output signal from the variable amplifier over a programmable amount of time. Thus, the present AGC is less susceptible to instantaneous changes in the power level of an input signal. Also, the variable amplifier of the present invention will not alter its gain unless one of two additional conditions is met. Both the "increase" and the "decrease" gain commands of the present invention are controlled similarly, and for the sake of brevity only the "increase gain" command is discussed here. It is to be understood that a similar functional description is applicable to the "decrease gain" command, unless otherwise noted.

The first condition required for changing the gain of the present variable amplifier is designed to prevent any noticeable "clap" at its output. For example, if the output from the AGC were being applied to a speaker and the "increase gain" command were actuated when the variable amplifier's output was at a high enough voltage to be audible at the speaker's output, the "increase gain" command would cause an abrupt increase in the gain of the variable amplifier resulting in an audible "clap". To minimize this effect, the first of the two conditions requires that the "increase gain" command wait until the input signal to the variable amplifier drops to within a predetermined low magnitude. Since the input signal may be positive or negative, this predetermined low magnitude is in actuality a plus or minus region surrounding a reference ground that may be thought of as a "preferred gain transition region".

The "preferred gain transition region" may be selected close enough to the reference ground so that an abrupt increase (or decrease) in the gain of the variable amplifier does not cause a noticeable "clap" at the speaker output. This first condition, however, poses the problem of what to do if the input signal stays beyond the "preferred gain transition region", for an extended period of time and thus does not meet the first criteria for receiving an increase (or decrease) command.

The second criteria under which the present variable amplifier may respond to an "increase (or decrease) gain" command addresses this problem. The present invention includes a timer. If a predetermined amount of time elapses without the input signal moving into the "preferred gain transition region", then the timer will issue the an overriding "increase gain" command regardless of whether it results in a noticeable "clap". In the presently preferred embodiment, the AGC of the present invention waits up to 0.1 seconds for the input signal to move into the "preferred gain transition region" before issuing the overriding "increase (or decrease) gain" command.

Structurally, the output of the variable amplifier is rectified and applied to an integrator. The amount of time over which the rectified output is integrated is substantially equal to an "attack time" controlled via a first register. By integrating the output signal, the present AGC obtains a measure of the output signal's average power over the selected "attack time". The integrator output is applied to a comparator preferably having a 1 dB hysteresis. The comparator compares the integrator's output with a power reference signal, which effectively establishes a preferred active power range. This power reference signal is selected from a ROM containing available values. The output of the comparator is coupled to a first logic box (time controller) that controls when the variable amplifier receives the "increase (or decrease) gain" command.

The present AGC also monitors the input signal to its variable amplifier. If the input signal to its variable amplifier were within the stated "preferred gain transition region", the first logic box would apply the "increase gain" command to the variable amplifier a first delay time after the comparison of the integrator output and the reference power signal. Similarly, the first logic box would apply the "decrease gain" command to the variable amplifier a second delay time after the comparison of the integrator output and the reference power signal. The first and second delay times are stored in respective registers, and the attack time is preferably equal to the second delay time.

The first logic box also receives an enable signal that tells it when it may cause a change in the gain of the variable amplifier. In other words, the output from the comparator will not be transmitted to the variable amplifier (even after the elapse of the first or second delay times) unless the enable signal is actuated. This enable signal is not actuated unless the input signal to the variable amplifier is within the "preferred gain transition region" or unless 0.1 seconds have elapsed since the first logic block received the change gain command from the comparator.

Therefore, the input to the present variable amplifier is also applied to a feedforward system including a second rectifier whose output is coupled to a second comparator. The second comparator compares the input to the present variable amplifier with an intensity reference signal. The magnitude of the intensity reference signal is chosen from a second ROM, and it establishes the "preferred gain transition region". The output from this second comparator is applied to a second logic box including the 0.1 second timer, which controls the actuation of the enable signal to the first logic box. The second logic box actuates the enable signal if the second comparator indicates that the input signal is within the "preferred gain transition region" or if 0.1 seconds have elapsed since the first logic box received the change gain command from the comparator.

The present variable amplifier is basically a multiplier which multiplies its input signal by a specific coefficient to either increase or decrease the magnitude of the input signal. To accomplish this, the variable amplifier is preferably digital and the coefficients are selected from a ROM. The coefficients are preferably always less then one. If the input signal is to be attenuated, then the input signal is directly multiplied by the appropriate coefficient. If the input signal is to be amplified, then the input signal is first multiplied by an appropriate coefficient, and the result is added to the original input signal. In this manner, the input signal is always multiplied by a positive coefficient, and the present multiplier may be optimized to use fewer logic gates than a multiplier that multiplies two signed numbers.

BRIEF DESCRIPTION OF THE DRAWINGS

FIG. 3 is a pictorial illustration of the application of an "amplify" command that results in a clap effect at a speaker output.

FIG. 4 is a pictorial illustration of the application of an "amplify" command that avoids the clap effect at a speaker output.

BEST MODE FOR CARRYING OUT THE INVENTION

Figure 1:
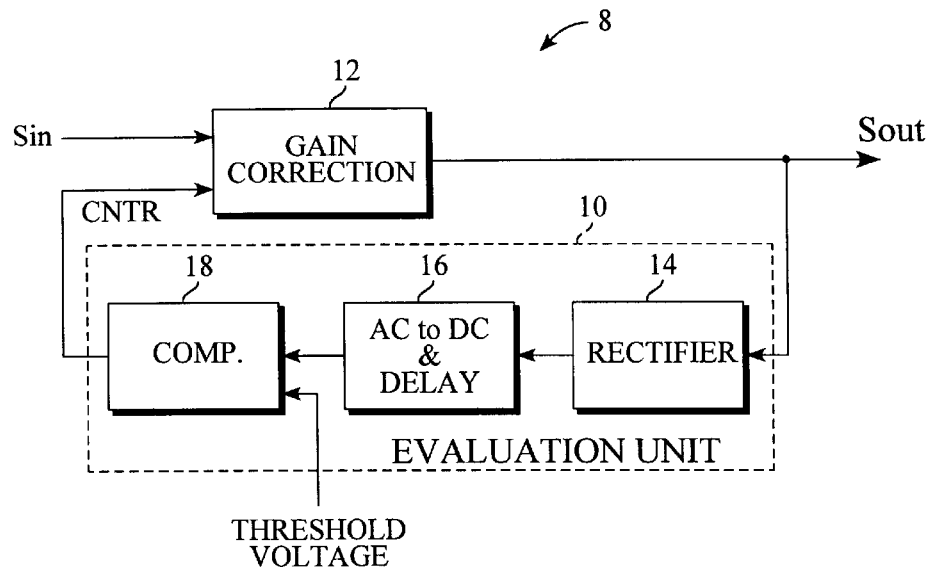
FIG. 1 is a block diagram of a prior art automatic gain control circuit.
Figure 2:
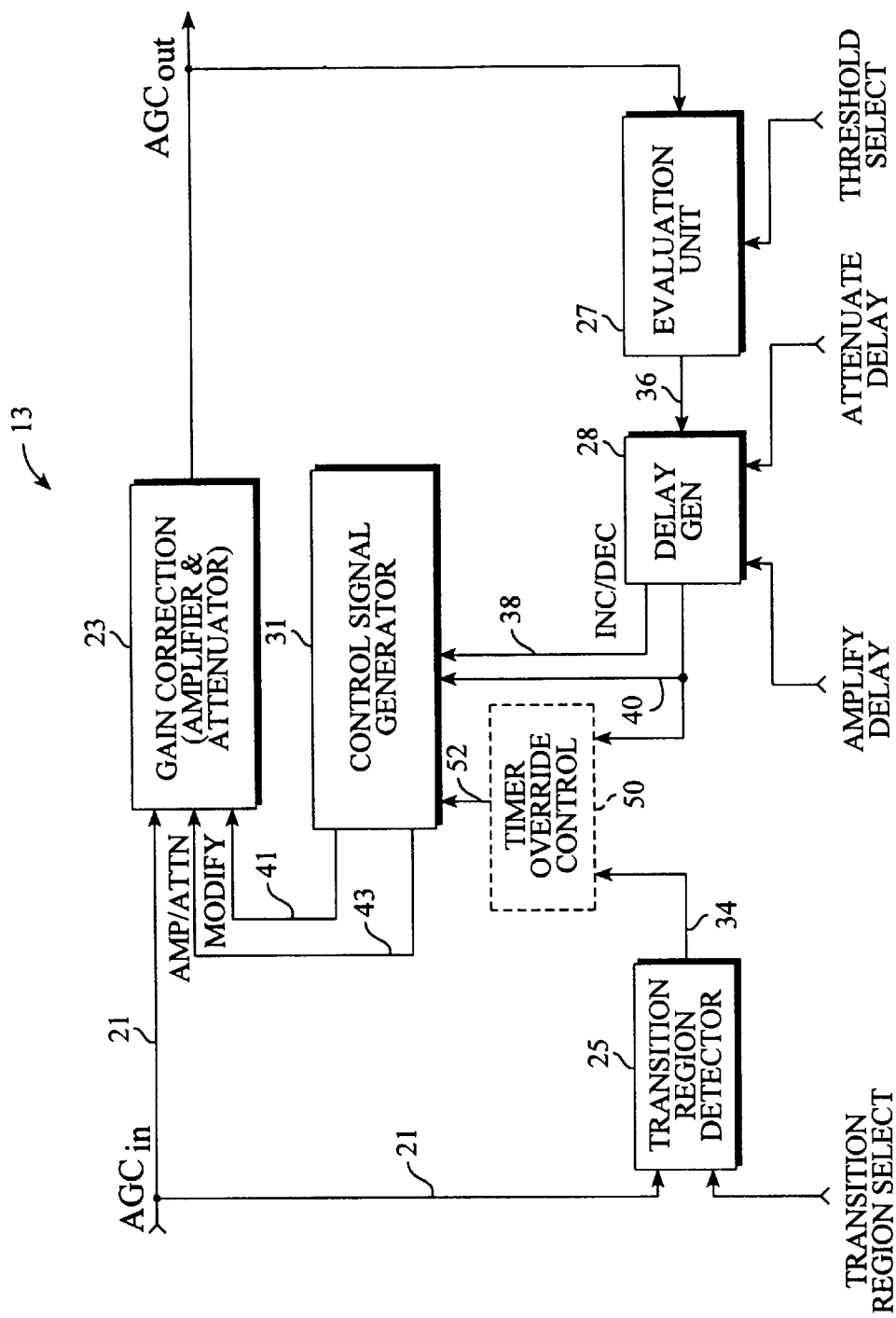
FIG. 2 is a block diagram of an automatic gain control circuit in accord with present invention.

With reference to FIG. 2, the block structure of an AGC 13 in accord with the present invention is shown. As was stated above, the prior art AGC 8 of FIG. 1 is characterized by an evaluation unit 10 in a feedback system monitoring output signal Sout of AGC 8. By contrast, the AGC 13 of FIG. 2 is characterized not only by an evaluation unit 27 in a feedback circuit monitoring its output signal $AGC_{out}$, but also characterized by a feedforward circuit 25 monitoring its input signal $AGC_{in}$.

Input signal $AGC_{in}$ on line 21 is applied to gain correction unit 23, which includes an amplifier and attenuator. Gain correction unit 23 is responsive to two control signals 41 and 43. Control signal 43 is a gain-change signal indicating whether $AGC_{in}$ should be amplified or attenuated. Control signal 41 is a modify control signal indicating when gain correction unit 23 may respond to control signal 43. Unlike the prior art, gain correction unit 23 does not respond immediately to a change on its gain-change control input 43, but rather must wait for modify control signal 41 to indicate that it may respond to an amplify or attenuate command on control signal 43.

Having control of when gain correction unit 23 may respond to an amplify/attenuate signal on its gain-change signal 43, allows for the establishment of a preferred transition region. Preferably, gain correction unit 23 does not alter its gain unless input signal $AGC_{in}$ is within this preferred transition region. By having a preferred transition region, much of the undesirable "clap" effect discussed above may be minimized and the overall output quality of AGC 13 may be improved.

With reference to FIG. 3, a graphical representation of the "clap" effect is shown. Plot 60 is a representation of $AGC_{out}$ versus time without a preferred transition region. In the present example, it is assumed that $AGC_{out}$ is applied to a speaker to produce an audible tone. Plot 60 is shown to ramp upward toward line 61. At line 61, gain correction unit 23 of FIG. 2 receives an "amplify gain" command on line 43. If gain correction unit 23 did not have a preferred transition region, then it would immediately respond to the "amplify gain" command and cause a step increase in the amplitude of $AGC_{out}$. In the present example, gain correction unit 23 increases $AGC_{out}$ in 0.5 dB steps. Since $AGC_{out}$ would change when it had a high and audible magnitude, the sudden increase in amplitude would result in an audible break, or "clap, in the tone at the speaker output. This break, or clap, reduces the overall output quality of $AGC_{out}$.

With reference to FIG. 4, plot 62 is a representation of $AGC_{out}$ versus time with an enforced preferred transition region 63. In this example, $AGC_{out}$ is again assumed to be applied to a speaker to produce an audible tone. Plot 62 is shown to ramp upward toward line 61. Again, line 61 indicates when gain correction unit 23 of FIG. 2 receives an "amplify gain" command on line 43. Since the present example has a preferred transition region 63, however, modify control input 41 will send a "don't modify" command to gain correction unit 23 forcing a wait phase until input signal $AGC_{in}$ is within the preferred transition region and AGC out reaches line 65. At line 65, modify control input 41 sends an "OK to modify" signal to gain correction unit 23 permitting it to respond to the "increase gain" command on line 43 and increase $AGC_{out}$ by a preferred 0.5 dB step. Transition region 63 is preferably selected about ground and given a range such that an abrupt gain change is not audibly noticeable at the speaker output. Since $AGC_{out}$ is at a low, inaudible magnitude when the increase gain-step is applied at line 65, the sudden 0.5 dB increase in amplitude does not result in an audible tone change, or clap, at the speaker output. The overall output quality of $AGC_{out}$ is thereby improved.

Returning to FIG. 2, control lines 43 and 41 are shown generated by a control signal generator 31 responsive to both $AGC_{in}$ and $AGC_{out}$. In order to determine when $AGC_{in}$ is within the preferred transition region, $AGC_{in}$ is applied to a transition region detector 25. Transition region detector 25 also receives a transition region select signal, which indicates the boundary of the preferred transition region above and below ground. Transition region detector 25 basically functions as a comparator determining when $AGC_{in}$ is within the boundaries of the preferred transition region, and places its output on line 34, which is coupled to an optional timer override control 50. If timer override control 50 is not used, then the output from transition region detector 25 may be applied directly to control signal generator 31.

Optional timer override control 50 prevents a condition that may apply an excessive delay, or completely prevent, the application of modify control input 41 to gain correction unit 23. Basically, if the modify control input 41 must always wait for line 34 to indicate that $AGC_{in}$ is within the preferred transition region, then a situation may arise when $AGC_{in}$ remains outside the preferred transition region for an unreasonably long extent of time. This would prevent gain correction unit 23 from responding to a gain-change command on control line 43 in a timely manner. Therefore, timer override control 50 resets an internal clocking means, of preferably 0.1 to 0.2 seconds, every time evaluation unit 27 and delay generator 28 send a new "increment" or "decrement" command on line 38 to control signal generator 31. In the presently preferred embodiment, delay generator 28 has an output line 40 coupled to timer override control 50 and to control signal generator 31 to indicate when its line 38 has a new increment or decrement command.

Timer override control 50 preferably resets its internal clocking means every time line 34 indicates that $AGC_{in}$ is within the preferred transition region or when line 40 indicates that a new increment/decrement command is being placed onto line 38. Thus, if the clocking means within timer override control 50 times out before $AGC_{in}$ enters the preferred transition region, then timer override control 50 will enable control signal generator 31 to actuate modify control line 41. This will allow gain correction unit 23 to respond an amplify and attenuate command control line 43. In other words, timer override control 50 places a limit on the length of the forced wait phase, shown in FIG. 4, before application of a gain change in $AGC_{out}$.

The feedback part of the present in invention begins in the typical manner by coupling output $AGC_{out}$ of gain correction unit 23 to evaluation unit 27. In the preferred embodiment, evaluation unit 27 does not directly compare the amplitude of $AGC_{out}$ with a simple reference signal. Rather, the present invention compares a measure of the signal strength of $AGC_{out}$ over a predefined time period with a threshold select signal. Within evaluation unit 27, $AGC_{out}$ is first rectified and then applied to an integrator for a predetermined time period. The result of the integrator is a measure of the signal strength of $AGC_{out}$, and this strength measure is compared with the threshold signal. By comparing the rectified, integral sum of $AGC_{out}$ to a reference threshold, instead of comparing the instantaneous amplitude of $AGC_{out}$, the present invention monitors $AGC_{out}$'s signal envelope and not the signal itself. This permits the present invention to avoid responding to instantaneous changes in $AGC_{out}$ and respond only to actual changes in the signal strength of $AGC_{out}$. Additionally, the present invention can modify the shape of the signal envelope for specialized applications, as more fully explained below.

Additionally, unlike the prior art, the attack time, i.e. delay time before the transmittal of an amplify or attenuate signal from evaluation unit 27 to gain correction unit 23, is not constant. Rather, evaluation unit 27 applies its output 36 to a delay generator 28, which adds the appropriate delay to line 36 before transmitting it to line 38.

Delay generator 28 receives an amplify delay signal, which determines the amount of delay placed on an "amplify" command coming from evaluation unit 27 before it is transmitted to inc/dec signal 38. Similarly, delay generator 28 also receives an attenuate delay signal, which determines the amount of delay placed on an "attenuate" command coming from evaluation unit 27 before it is transmitted to inc/dec signal 38. Thus, the AGC 13 of the present invention does not have a constant "attack time" for both amplify and attenuate commands. Rather, the present invention can individually assign different delay times to "amplify" and "attenuate" commands, as required for a specific application.

These adjustable delays in combination with the ability of evaluation unit 27 to respond to the integral signal strength of $AGC_{out}$, permits the present invention to modify the signal envelope of an input signal instead of the signal itself. By adjusting the delay periods added to "amplify" and "attenuate" commands, the present AGC 13 can modify the signal envelope and adapt itself "on the fly" to specific types of inputs. For example, an audio signal sampled at 44.1 KHz has a different bandwidth than a voice signal sampled at 8 KHz. More over, if the AGC input signal comes from a microphone, its envelope will be different than an input signal that comes from a radio.

Another example would be if AGC 13 is used in an application where its input $AGC_{in}$ is prone to frequent, but short-lived, noise spikes, the delay for responding to an "attenuate" command could be made longer than the delay for an "amplify" command. Thus, if $AGC_{in}$ were to experience an upward spike, then AGC 13 could first wait and see if this spike is due to a short-lived noise fluctuation and $AGC_{in}$ will return back to normal amplitude by itself, or whether the spike represents an actual change in the signal intensity of $AGC_{in}$ and thus needs to be attenuated.

Line 40 indicates when delay generator 28 has transmitted a signal from line 36 to line 38 to let control signal generator 31 and timer override control 50 know that line 38 has a new inc/dec command. Control signal generator 31 receives line 52 from timer override control 50 and receives lines 40 and 38 from delay generator 28. An inc/dec command from line 38 is transferred to line 43, and the modify command line 41 is asserted when line 52 indicates that gain correction unit 23 may alter its gain. In effect, line 52 functions as an enable input to control signal generator 31.

The structure of FIG. 2 may be realized in both analog and/or digital circuitry. In the remaining figures, however, applicants present a preferred digital implementation of the structure of FIG. 2. The analog circuit construct of the structural block diagram of FIG. 2 is considered to be within the scope of those versed in the art.

Figure 5:
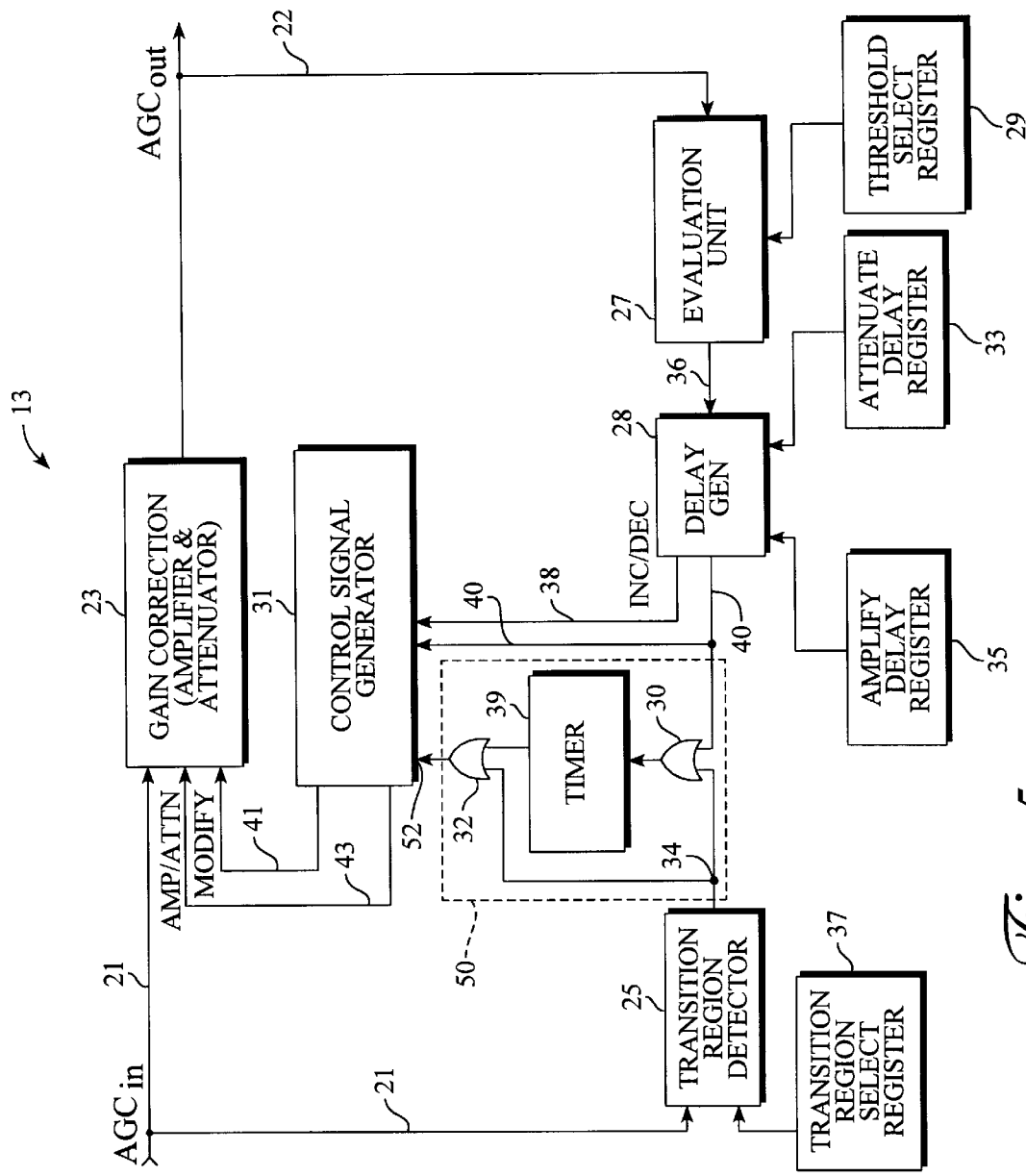
FIG. 5 portrays an is a representation of a digital implementation of the block diagram of FIG. 2.

With reference to FIG. 5, registers 29, 33, 35 and 37 hold the reference inputs to various functional blocks of AGC 13. Threshold select register 29 holds the reference threshold input to evaluation unit 27. Evaluation unit 27 evaluates the rectified average value of $AGC_{out}$, and compares it to the programmable threshold stored in threshold select register 29. The result of the comparison places a gain signal, logic 0/1, on line 36 indicating whether the gain of correction unit 23 should be decreased or increased, respectively. Delay generator 28 transfers the data on line 36 to line 38 after a specified delay time.

Attenuate delay register 33 holds the amount of delay that delay generator 28 should apply to an "attenuate" command coming from evaluation unit 27. Similarly, amplify delay register 35 holds the amount of delay that delay generator 28 should apply to an "amplify" command coming from evaluation unit 27. These two programmable delays are used to control the envelope of the signal instead of signal itself. Registers 33 and 35 thus permit AGC 13 to configure itself "on the fly" to specific input signals at node 21 while continuing to correct for gain fluctuations at its input node 21.

Delay generator 28 generates the "amplify" and the "attenuate" delay times by mean of an internal timer. Preferably, amplify delay register 35 is a 2-bit register and its contents have a fixed correspondence to one of four possible amplify delay times as follows:

| Amplify Delay Register (2-Bit) | Amplify Delay Time ms/0.5 dB |
| --- | --- |
| 0 | 100 |
| 1 | 200 |
| 2 | 400 |
| 3 | 800 |

Similarly, attenuate delay register 33 is preferably also a 2-bit register and its contents also have a one-to-one correspondence to four possible attenuate delay times as follows:

| Attenuate Delay Register (2-Bit) | Attenuate Delay Time ms/0.5 dB |
| --- | --- |
| 0 | 2 |
| 1 | 4 |
| 2 | 8 |
| 3 | 16 |

Transition region select register 37 holds one of a number of predetermined transition region boundary levels, as explained more fully below. The selected boundary level is applied to transition region detector 25, which compares it with $AGC_{in}$ and places the result of the comparison on line 34.

FIG. 5 also shows an internal view of one embodiment of timer override control 50. Preferably, timer override control 50 has a master clock of 10.368 MHz and is used to generate all the time requirements by the system. Block 50 is used to force gain correction unit 23 to update its gain level even if input signal $AGC_{in}$ is not within the preferred transition region set by transition region select register 37.

A timer 39 is used to insure that the gain setting of gain correction unit 23 will change even when there is no zero crossing of digital input signal $AGC_{in}$. Timer 39 is preferably fixed to 0.1 seconds. If within this time period $AGC_{in}$ has not entered the preferred transition region, timer 39 will issue an override signal causing AGC 13 to consider $AGC_{in}$ as a "non-zero crossing signal" and update its gain. Thus, gain can change when signal $AGC_{in}$ is within the preferred transition region or when timer 39 times out 0.1 seconds.

If $AGC_{in}$ is within the preferred transition region selected by transition region select register 37, then transition region detector 25 will preferably place a logic high on OR gates 30 and 32. The first OR gate 30 will reset timer 39, and timer 39 will remain reset until the output from OR 30 goes low. The second OR gate 32 transmits an enable signal on line 52 to control signal generator 31 permitting it to respond to the inputs from delay generator 28 and to update control lines 43 and 41, as necessary. If $AGC_{in}$ is outside the preferred transition region, then transition region detector 25 will place a logic low on OR gates 30 and 32. Placing a logic low on OR gate 30 transfers control of timer 39 to delay generator 28. Similarly, placing a logic low on OR gate 32 transfers control of control signal generator 31 to timer 39.

Delay generator 28 places a logic high pulse on line 40 whenever a new gain instruction is placed on line 38. A logic high pulse on line 40 while line 34 has a logic low, causes timer 39 to reset and begin its 0.1 second time out period. If timer 39 finishes its 0.1 second time out period without $AGC_{in}$ entering the preferred transition region and resetting timer 39, then timer 39 will send a logic high to OR gate 32. This transmits an enable signal to control signal generator 31, which permits control signal generator 31 to respond to the inputs from delay generator 28 and to update control line 43 and 41, as necessary.

Figure 6:
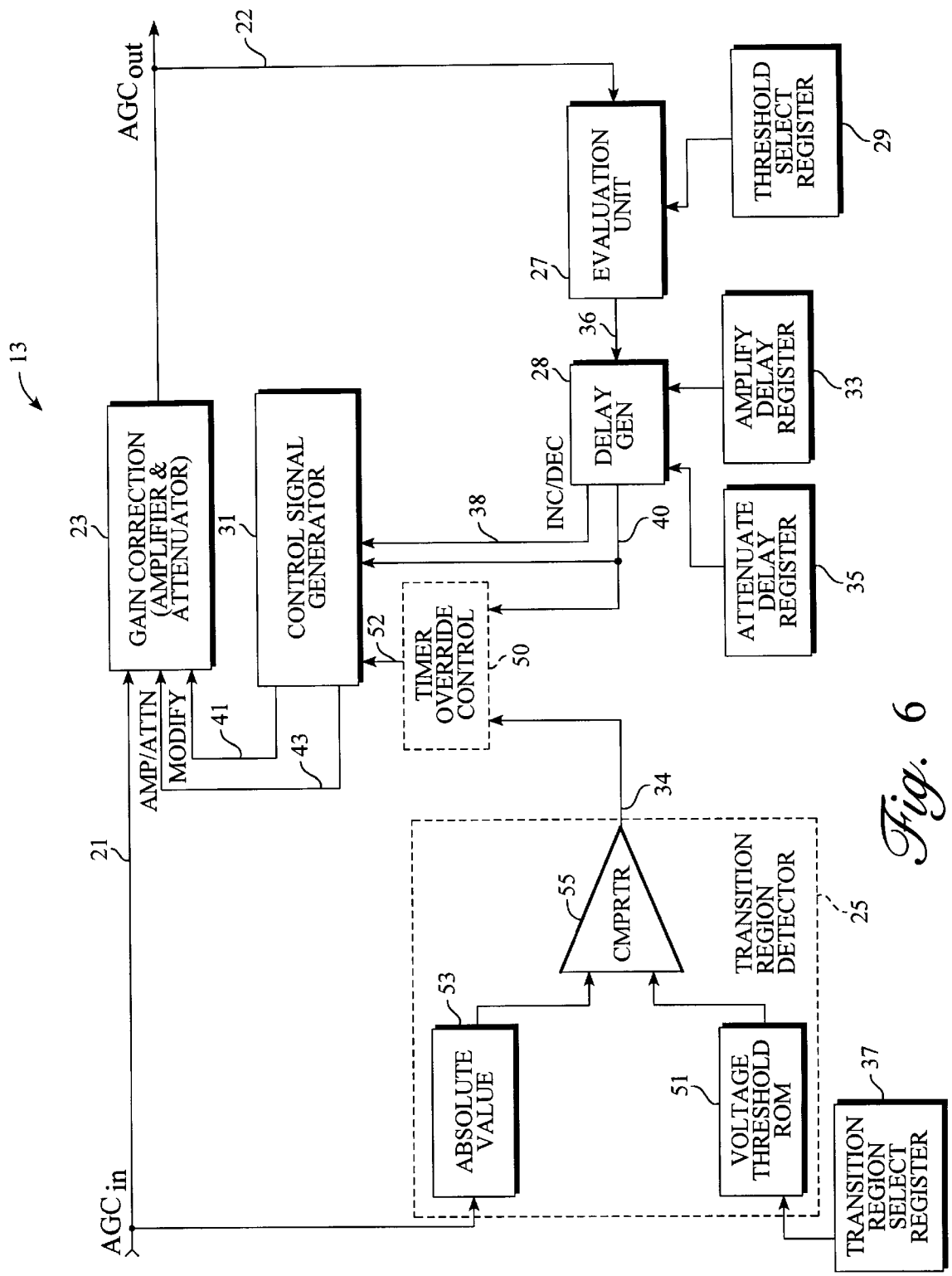
FIG. 6 is an internal view of the transition region detector shown in FIG. 5.

With reference to FIG. 6 an internal view of a preferred transiting region detector 25 is shown. Input signal $AGC_{in}$ is applied to an absolute value circuit 53, which effectively rectifies signal $AGC_{in}$ and transfers the resultantant magnitude to a comparator 55. Transition region select register 37 selects one of a number of predetermined transition region boundary levels stored in a voltage threshold ROM 51. Below is an example of preferred boundary levels stored in ROM 51 and their corresponding register label.

| Threshold Region Select Register (3-Bit) | Percent of Digital Full Scale | Threshold Min Value (db) | Coefficient Stored in ROM (51) |
|---|---|---|---|
| 0 | 1 | −40 | 328 |
| 1 | 2 | −34 | 655 |
| 2 | 5 | −26 | 1638 |
| 3 | 10 | −20 | 3277 |
| 4 | 30 | −10 | 9830 |
| 5 | 50 | −6 | 16384 |
| 6 | 70 | −3 | 22938 |
| 7 | 100 | −0 | 32767 |

The above table also includes a list of example coefficients stored in ROM 51 for achieving the desired preferred transition region. These sample coefficients are based on the assumption that an input signal at node 21 arrives in 16 bit words and therefore varies from −32768 to +32767. Thus, the sample coefficients correspond to an input with a 0 to 32767 (15 bit unsigned) level of resolution. The selected threshold level from ROM 51 is transferred to comparator 55, which compares it with the magnitude of $AGC_{in}$ and transfers the result onto line 34.

Figure 7:
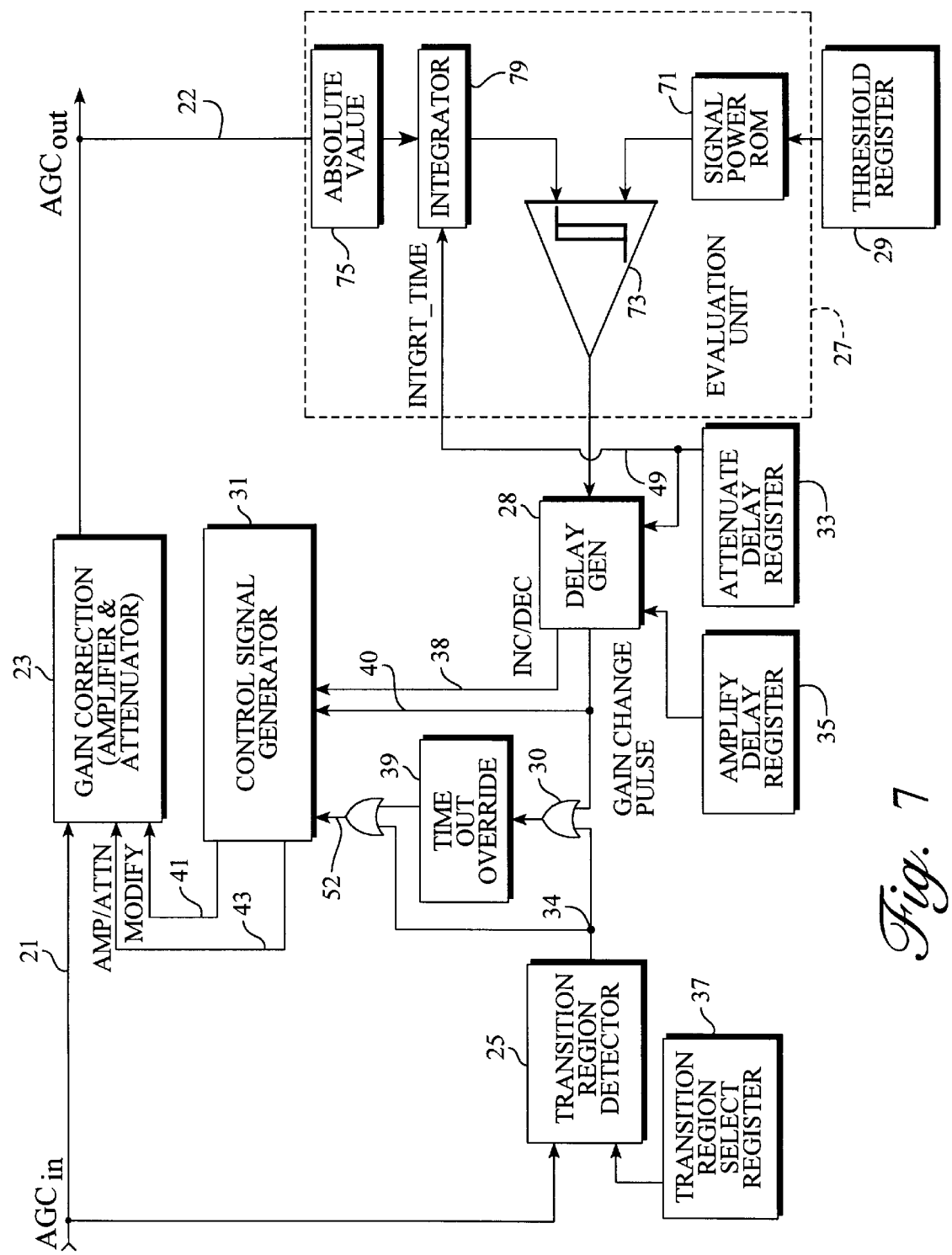
FIG. 7 portrays an internal view of the evaluation unit shown in FIG. 5.

In FIG. 7, an internal view of a preferred evaluation unit 27 is shown. Unlike the traditional evaluation unit shown in FIG. 1, which monitor the magnitude of an output signal Sout, the presently preferred evaluation unit shown in FIG. 7 monitors the average power of its output signal $AGC_{out}$ on line 22 over a predetermined period. Output signal $AGC_{out}$ is applied to an absolute value circuit 75, which functions as a digital full-wave rectifier. Absolute value circuit 75 transfers the magnitude of $AGC_{out}$ to a parameterable integrator 79 whose integration time may be dynamically adjusted. By integrating $AGC_{out}$ over a programmable integration time, the present evaluation unit 27 monitors a measure of $AGC_{out}$'s power level. Preferably, the programmable integration time is set equal to the "attenuate" delay stored within attenuate delay register 33 such at the attenuate delay time is also used to set the integration time. The output from integrator 79 is applied to a comparator 73 preferably having a 1 dB hysteresis to avoid oscillation.

Threshold select register 29 selects one of a number of predetermined power levels stored in a signal power ROM 71. Preferably, threshold select register 29 is a four bit register and selects one of the ROM power threshold values as follows:

| Threshold register (29) (4 bits) | Threshold value (dBm0) | Threshold value (dB) | Coefficient Stored in Signal Power ROM (71) |
|---|---|---|---|
| 0 | 0 dbmo | −03.14 dB | 22827 |
| 1 | −1 dbmo | −04.14 dB | 20345 |
| 2 | −2 dbmo | −05.14 dB | 18132 |
| 3 | −3 dbmo | −06.14 dB | 16160 |
| 4 | −4 dbmo | −07.14 dB | 14403 |
| 5 | −5 dbmo | −08.14 dB | 12837 |
| 6 | −6 dbmo | −09.14 dB | 11441 |
| 7 | −7 dbmo | −10.14 dB | 10196 |
| 8 | −8 dbmo | −11.14 dB | 09088 |
| 9 | −9 dbmo | −12.14 dB | 08099 |
| 10 | −10 dbmo | −13.14 dB | 07218 |
| 11 | −11 dbmo | −14.14 dB | 06434 |
| 12 | −12 dbmo | −15.14 dB | 05734 |
| 13 | −13 dbmo | −16.14 dB | 05110 |
| 14 | −14 dbmo | −17.14 dB | 04556 |
| 15 | −15 dbmo | −18.14 dB | 04059 |

Where 0 dBmo is defined as an initial −3.14 dB offset below the digital full scale, and each additional −1 dBmo corresponds to an addition −1 dB decrease in a one-to-one relationship.

The selected threshold power level from signal power ROM 71 is applied to hysteresis comparator 73, which compares it with the average power measured by integrator 79. If the average power level of $AGC_{out}$ falls below the power threshold selected by ROM 71, then hysteresis comparator 73 issues an amplify command to delay generator 28. On the other hand, if the power level of $AGC_{out}$ rises above the power threshold selected by ROM 71, then hysteresis comparator 73 issues an attenuate command to delay generator 28.

Figure 8:
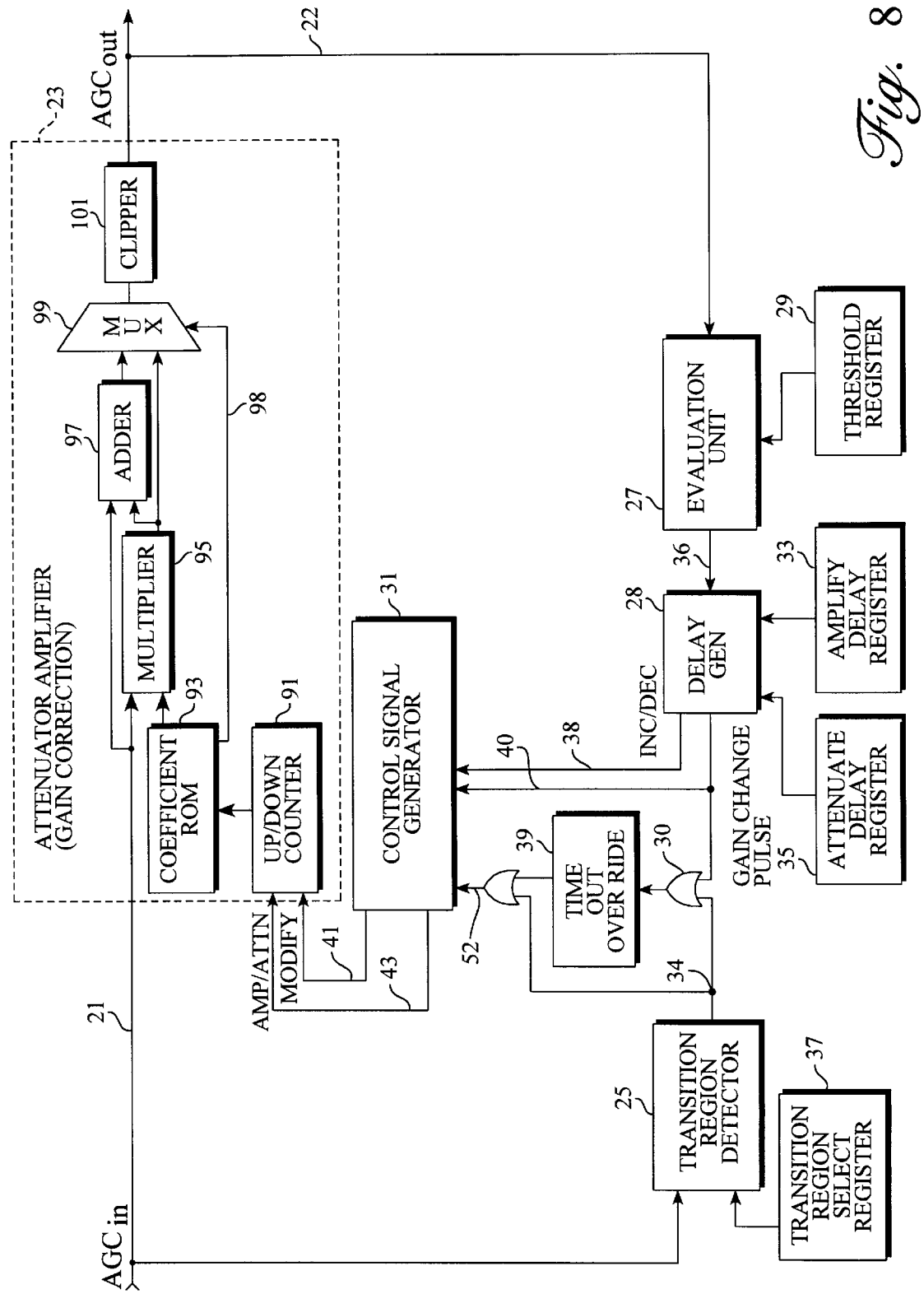
FIG. 8 portrays an internal view of the gain correction unit shown in FIG. 5.

With reference to FIG. 8, the internal structure of a preferred gain correction unit 23 in accord with present invention is shown. Control lines 41 and 43 from control signal generator 31 are applied to an up/down counter 91 within gain correction unit 23. Preferably, up/down counter 91 scans through twenty-five coefficients stored in a coefficient ROM 93. A selected coefficient from coefficient ROM 93 is multiplied with input signal AGCin by means of a multiplier 95.

In order to decrease the number of logic gates, multiplier 95 is preferably a signed by unsigned multiplier instead of a fully signed multiplier. In other words, multiplier 95 can only multiply unsigned numbers and can therefore not support negative numbers. In order to be able to attenuate and amplify an input signal $AGC_{in}$ while multiplying it only with positive coefficients, all coefficients within ROM 93 have a value less than unity. Coefficient ROM 93 has an additional control line 98 coupled to a control input of a multiplexer 99. If input $AGC_{in}$ is to be attenuated, a logic low is placed on control line 98 causing multiplexer 99 to couple the output of multiplier 95 to a clipper 101. Input $AGC_{in}$ is multiplied by the appropriate coefficient from ROM 93 and the result is sent to the output $AGC_{out}$ via multiplexer 99 and clipper 101. If input $AGC_{in}$ is to amplified, a logic high is placed on control line 98 causing multiplexer 99 to couple the output of adder 97 to clipper 101. Input $AGC_{in}$ is again multiplied by a coefficient smaller than one from ROM 93. The result is added to the original value of $AGC_{in}$ by adder 97 before being sent to the output $AGC_{out}$ via multiplexer 99 and clipper 101.

To accomplish this, input $AGC_{in}$ is applied to both multiplier 95 and to a first input of adder 97. The output from multiplier 95 is sent to a first input of a multiplexer 99 and sent to a second input of adder 97. The result from adder 97 is applied to a second input of multiplexer 99. Thus, multiplexer 99 receives both the attenuated $AGC_{in}$ value from multiplier 95 and the amplified $AGC_{in}$ value from adder 97. If input signal $AGC_{in}$ is to be attenuated, then multiplexer 99 transfers the output from multiplier 95 to clipping circuit 101. If input signal $AGC_{in}$ is to be amplified, then multiplexer 99 transfers the output from adder 97 to clipping circuit 101. Clipping circuit 101 produces $AGC_{out}$, and clips the output from multiplexer 99 to digital full scale if an overflow is detected.

In the presently preferred embodiment, gain correction unit 23 can increases and decreases its power gain in 0.5 dB steps and has a power gain correction range of ±6 dB. Thus, the power level of input $AGC_{in}$ may be reduced to one quarter its original value at −6 dB and may be increased up to four times it original value at +6 dB.

The actual amplitude of $AGC_{in}$, however, does not need to be increased by more than twice it original value. Since the power level is directly proportional to the square of the amplitude of input signal $AGC_{in}$ and since the power level is defined as $20*\log(AGC_{out}/AGC_{in})$, a ±6 dB power ratio range translates into an equivalent $AGC_{out}/AGC_{in}$ amplitude ratio ranging from one-half to two. For example, the presently preferred embodiment uses a 7 bit full-scale with a maximum coefficient of 127. The table below shows exemplary coefficient values stored in coefficient ROM 93 for achieving a −6 dB to +6 dB gain range. The logic value of additional control line 98 is also shown.

| Gain to Apply | Coefficient stored in ROM (93) | Additional Control Line 98 |
|---|---|---|
| −6 dB | 64 | 0 |
| −5.5 dB | 68 | 0 |
| −5 dB | 72 | 0 |
| −4.5 dB | 76 | 0 |
| −4 dB | 81 | 0 |
| −3.5 dB | 86 | 0 |
| −3 dB | 91 | 0 |
| −2.5 dB | 96 | 0 |
| −2 dB | 102 | 0 |
| −1.5 dB | 108 | 0 |
| −1 dB | 114 | 0 |
| −0.5 | 121 | 0 |
| 0 dB | 127 | 0 |
| +0.5 dB | 8 | 1 |
| +1 dB | 16 | 1 |
| +1.5 dB | 24 | 1 |
| +2 dB | 33 | 1 |
| +2.5 dB | 43 | 1 |
| +3 dB | 53 | 1 |
| +3.5 dB | 64 | 1 |
| +4 dB | 75 | 1 |
| +4.5 dB | 87 | 1 |
| +5 dB | 100 | 1 |
| +5.5 dB | 113 | 1 |
| +6 dB | 127 | 1 |

For example, if the desired gain is −2.5 dB, then the real representation of an appropriate coefficient is $10^{(-2.5/20)}$, or 0.749. That is, an input signal at line 21 should be multiplied by 0.749 to achieve a −2.5 dB gain. Since the preferred digital full scale of coefficient ROM 93 is 127 (i.e., 7-bit resolution), the corresponding coefficient stored in ROM 93 is 0.749∗127, or 96. Similarly, to achieve a +1.5 dB gain, an input signal at node 21 should be multiplied by $10^{(+1.5/20)}$, or 1.1885. This corresponds to a value of 0.1885×127, or 24, stored in coefficient ROM 93. Input signal $AGC_{in}$ is multiplied by 24 and the result is added to the original value of $AGC_{in}$. If an input at node 21 should not be attenuated or amplified, i.e., have a gain of 1, then input signal $AGC_{in}$ is multiplied by the ROM full scale of 127.

Figure 9:
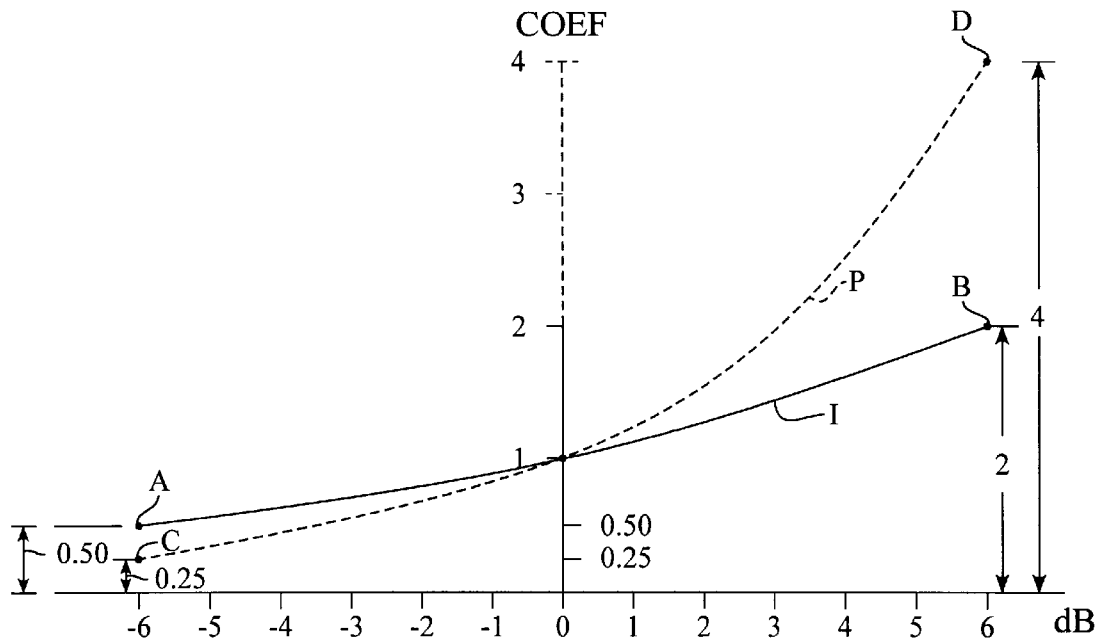
FIG. 9 illustrates the relationship between a signal's amplitude gain and its power gain.

FIG. 9 shows that as the amplitude, or intensity, ratio, "I", of $AGC_{out}/AGC_{in}$ varies from one-half its value, 0.5, at point A to twice its value, 2.0, at point B, its equivalent power ration "P" varies from one-quarter its normalized value, 0.25, at point C to four times its value, 4.0, at point D and thus achieves a ±6 dB power range.

In order to simplify the circuitry of multiplier 95, however, ROM 93 only holds coefficients with values smaller than 1.0. Therefore, ROM 93 can store the correct coefficient value for achieving an intensity ratio "I" smaller then one, but does not store the correct coefficient value for intensity ratios greater than one. As explained above, ROM 93 stores truncated coefficients for intensity ratios greater then one. Coefficients greater than one are first reduced by a value of one before being stored in ROM 93. Since adder 97 receives $AGC_{in}$, coefficient values greater than one can be reconstructed by adding the whole value of $AGC_{in}$ to the product of $AGC_{in}$ and the truncated coefficient stored in ROM 93 obtained by multiplier 95. For example, to achieve a 2 dB power gain, $AGC_{in}$ needs to be multiplied by a coefficient value of 1.259. A similar result can be obtained by multiplying $AGC_{in}$ by a truncated coefficient value of 0.259 and adding the result to the original value of $AGC_{in}$. In other words, $1.259AGC_{in}=1.0AGC_{in}+0.259AGC_{in}$. In this case, the truncated value of 0.259, or 127×0.259=33, is stored in ROM 93 and adder 97 adds $AGC_{in}$ to the product of 33 and $AGC_{in}$, as determined by multiplier 95.

What is claimed is:

1. An automatic gain control circuit comprising:
   an input lead $AGC_{in}$ for receiving an input signal;
   an output lead $AGC_{out}$ for producing an output signal;
   a gain correction unit coupled to receive said input lead $AGC_{in}$ and selectively adjusting its gain to amplify or attenuate said input signal and place the resultant output signal on said output lead $AGC_{out}$; and
   a transition region detector coupled to receive said input lead $AGC_{in}$, said transition region detector producing a control output, said control output being coupled to said gain correction unit, said transition region detector being effective for placing a disable signal on said control output in response to said input signal having a magnitude greater than a predetermined value, said disable signal being effective for preventing said gain correction unit from adjusting its gain.

2. The automatic gain control of claim 1 wherein said transition region detector includes a transition region select input effective for selecting said predetermined value.

3. The automatic gain control of claim 2 wherein said predetermined value is selected from a table of values stored in a ROM.

4. The automatic gain control of claim 2 further having a region select register, the contents of said region select register being couple to said select input of said transition region detector.

5. The automatic gain control of claim 2 wherein said transition region detector further includes a rectifying unit receiving said input lead, the output from said rectifying unit being coupled to a first input of a comparator, said comparator having a second input coupled to received said predetermined value, the output from said comparator being coupled to selectively enable said gain correction unit to alter its gain.

6. The automatic gain control of claim 1 further including a timer for establishing a predetermined time-out period, said timer being effective for overriding said transition region detector and enabling said gain correction unit to adjust its gain.

7. The automatic gain control claim 6 wherein said timer has a time-out period of less than 2 ms.

8. The automatic gain control of claim 1 further having an evaluation unit for monitoring the output power of said resultant output signal on said $AGC_{out}$ lead, said evaluation unit being effective for comparing said output power with a reference power level and issuing an increase gain command in response to said output power being lower than said reference power level and issuing a decrease gain command in response to said output power being higher than said reference power level; and a delay generator responsive to said evaluation unit and effective for relaying said increase and decrease gain commands to said gain correction unit, said delay generators being further effective for adding a first variable delay to said increase gain command and adding a second variable delay to said decrease gain command before relaying them to said gain correction unit.

9. The automatic gain control of claim 8 wherein said evaluation unit includes an integrator for integrating said resultant output signal, said output signal being integrated for a period substantially similar to said second delay.

10. The automatic gain control of claim 8 wherein said reference power level is selected from a table of values stored in a ROM.

11. The automatic gain control of claim 10 further including a register for storing the address of said reference power within said ROM.

12. The automatic gain control of claim 8 wherein said evaluation unit further includes a rectifying means for obtaining the absolute value of said resultant output signal, said absolute value being applied to a an integrator effective for integrating said absolute value for a predetermined period.

13. The automatic gain control of claim 12 wherein said second delay is stored in a register and said register is further coupled to said integrator for selecting said predetermined period.

14. The automatic gain control of claim 8 wherein said first variable delay is not equal to said second variable delay.

15. The automatic gain control of claim 14 wherein said second variable delay is greater than said first variable delay.

16. The automatic gain control of claim 8 wherein said first and second variable delays are selected from a predetermined table of discrete delay magnitudes.

17. The automatic gain control of claim 16 wherein said table is stored in a ROM, said automatic gain control further having a first register for storing the address of said first delay within said ROM and having a second register for storing the address of said second delay within said ROM.

18. The automatic gain control of claim 1 wherein said gain correction unit is digital and includes a multiplier and adder;

said multiplier being coupled to receive said input lead $AGC_{in}$ and a coefficient value, said multiplier further having an intermediate output and being effective for multiplying said input lead $AGC_{in}$ by said coefficient and placing the result on said intermediate output;

said adder having a summing output and further receiving said input lead $AGC_{in}$ and also receiving said intermediate output, said adder being effective for summing said $AGC_{in}$ with said the contents of intermediate output and placing the result on said summing output.

19. The automatic gain control of claim 18 wherein said coefficient value is less then unity and said gain correction unit further includes a multiplexer receiving said intermediate output and said summing output, said multiplexer being effective for coupling said summing output to said $AGC_{out}$ in response to an increase gain command and effective for coupling said intermediate output to said $AGC_{out}$ in response to a decrease gain command.

20. The automatic gain control of claim 18 further including a ROM storing said coefficient values.

21. An automatic gain control circuit comprising:

an input lead $AGC_{in}$ for receiving an input signal;

an output lead $AGC_{out}$ for producing an output signal;

a gain correction unit coupled to receive said input lead $AGC_{in}$ and selectively adjusting its gain to amplify or attenuate said input signal and place the resultant output signal on said output lead $AGC_{out}$;

an evaluation unit for monitoring the output power on said resultant output signal on said $AGC_{out}$ lead, said evaluation unit being effective for comparing said output power with a reference power level and issuing an increase gain command in response to said output power being lower than said reference power level and issuing a decrease gain command in response to said output power being higher than said reference power level; and a delay generator responsive to said evaluation unit and effective for relaying said increase and decrease gain commands to said gain correction unit, said delay generators being further effective for adding a first variable delay to said increase gain command and adding a second variable delay to said decrease gain command before relaying them to said gain correction unit.

22. The automatic gain control of claim 21 wherein said first variable delay is not equal to said second variable delay.

23. The automatic gain control of claim 22 wherein said second variable delay is greater than said first variable delay.

24. The automatic gain control of claim 21 wherein said first and second variable delays are selected from a predetermined table of discrete delay magnitudes.

25. The automatic gain control of claim 24 wherein said table is stored in a ROM, said automatic gain control further having a first register for storing the address of said first delay within said ROM and having a second register for storing the address of said second delay within said ROM.

26. The automatic gain control of claim 21 wherein said evaluation unit includes an integrator for integrating said resultant output signal, said output signal being integrated for a period substantially similar to said second delay.

27. The automatic gain control of claim 21 wherein said reference power level is selected from a table of values stored in a ROM.

28. The automatic gain control of claim 27 further including a register for storing the address of said reference power within said ROM.

29. The automatic gain control of claim 21 wherein said evaluation unit further includes a rectifying means for obtaining the absolute value of said resultant output signal, said absolute value being applied to a an integrator effective for integrating said absolute value for a predetermined period.

30. The automatic gain control of claim 29 wherein said second delay is stored in a register and said register is further coupled to said integrator for selecting said predetermined period.

31. The automatic gain control of claim 21 wherein said gain correction unit is digital and includes a multiplier and adder;

said multiplier being coupled to receive said input lead $AGC_{in}$ and a coefficient value, said multiplier further having an intermediate output and being effective for multiplying said input lead $AGC_{in}$ by said coefficient and placing the result on said intermediate output;

said adder having a summing output and further receiving said input lead $AGC_{in}$ and also receiving said intermediate output, said adder being effective for summing said $AGC_{in}$ with said the contents of intermediate output and placing the result on said summing output.

32. The automatic gain control of claim 31 wherein said coefficient value is less then unity and said gain correction unit further includes a multiplexer receiving said intermediate output and said summing output, said multiplexer being effective for coupling said summing output to said $AGC_{out}$ in response to an increase gain command and effective for coupling said intermediate output to said $AGC_{out}$ in response to a decrease gain command.

33. The automatic gain control of claim 31 further including a ROM storing said coefficient values.

34. The automatic gain control of claim 21 further including a transition region detector coupled to receive said input lead $AGC_{in}$ and having a transition region select input effective for selecting a predetermined value, said transition region detector producing a control output, said control output being coupled to said gain correction unit, said transition region detector being effective for placing a disable signal on said control output in response to said input signal having a magnitude greater than said predetermined value, said disable signal being effective for preventing said gain correction unit from adjusting its gain.

35. The automatic gain control of claim 34 wherein said predetermined value is selected from a table of values stored in a ROM.

36. The automatic gain control of claim 34 further having a region select register, the contents of said region select register being couple to said select input of said transition region detector.

37. The automatic gain control of claim 34 wherein said transition region detector further includes a rectifying unit receiving said input lead, the output from said rectifying unit being coupled to a first input of a comparator, said comparator having a second input coupled to received said predetermined value, the output from said comparator being coupled to selectively enable said gain correction unit to alter its gain.

38. An automatic gain control circuit comprising:

an input lead $AGC_{in}$ for receiving an input signal;

an output lead $AGC_{out}$ for producing an output signal;

a gain correction unit coupled to receive said input lead $AGC_{in}$ and selectively adjusting its gain to amplify or attenuate said input signal and place the resultant output signal on said output lead $AGC_{out}$;

a transition region detector coupled to receive said input lead $AGC_1$, said transition region detector producing a control output, said control output being coupled to said gain correction unit, said transition region detector being effective for placing a disable signal on said control output in response to said input signal having a magnitude greater than a predetermined value, said disable signal being effective for preventing said gain correction unit from adjusting its gain;

a timer for establishing a predetermined time-out period, said timer being effective for overriding said transition region detector and enabling said gain correction unit to adjust its gain;

an evaluation unit for monitoring the output power of said output signal on said $AGC_{out}$ lead, said evaluation unit being effective for comparing said output power with a reference power level and issuing an increase gain command in response to said output power being lower than said reference power level and issuing a decrease gain command in response to said output power being higher than said reference power level; and a delay generator responsive to said evaluation unit and effective for relaying said increase and decrease gain commands to said gain correction unit, said delay generator being further effective for adding a first variable delay to said increase gain command and adding a second variable delay to said decrease gain command before relaying them to said gain correction unit.

39. The automatic gain control of claim 38 wherein said transition region detector includes a transition region select input effective for selecting said predetermined value.

40. The automatic gain control of claim 39 wherein said predetermined value is selected from a table of values stored in a ROM.

41. The automatic gain control of claim 39 further having a region select register, the contents of said region select register being couple to said select input of said transition region detector.

42. The automatic gain control of claim 39 wherein said transition region detector further includes a rectifying unit receiving said input lead, the output from said rectifying unit being coupled to a first input of a comparator, said comparator having a second input coupled to received said predetermined value, the output from said comparator being coupled to selectively enable said gain correction unit to alter its gain.

43. The automatic gain control of claim 40 wherein said first variable delay is not equal to said second variable delay.

44. The automatic gain control of claim 43 wherein said second variable delay is greater than said first variable delay.

45. The automatic gain control of claim 38 wherein said first and second variable delays are selected from a predetermined table of discrete delay magnitudes.

46. The automatic gain control of claim 45 wherein said table is stored in a ROM, said automatic gain control further having a first register for storing the address of said first delay within said ROM and having a second register for storing the address of said second delay within said ROM.

47. The automatic gain control of claim 38 wherein said gain correction unit is digital and includes a multiplier and adder;

said multiplier being coupled to receive said input lead $AGC_{in}$ and a coefficient value, said multiplier further having an intermediate output and being effective for multiplying said input lead $AGC_{in}$ by said coefficient and placing the result on said intermediate output;

said adder having a summing output and further receiving said input lead $AGC_{in}$ and also receiving said intermediate output, said adder being effective for summing said $AGC_{in}$ with said the contents of intermediate output and placing the result on said summing output.

48. The automatic gain control of claim 47 wherein said coefficient value is less then unity and said gain correction unit further includes a multiplexer receiving said intermediate output and said summing output, said multiplexer being effective for coupling said summing output to said $AGC_{out}$ in response to an increase gain command and effective for coupling said intermediate output to said $AGC_{out}$ in response to a decrease gain command.

49. The automatic gain control of claim 47 further including a ROM storing said coefficient values.

50. The automatic gain control of claim 38 wherein said evaluation unit includes an integrator for integrating said resultant output signal, said output signal being integrated for a period substantially similar to said second delay.

51. The automatic gain control of claim 38 wherein said reference power level is selected from a table of values stored in a ROM.

52. The automatic gain control of claim 51 further including a register for storing the address of said reference power within said ROM.

53. The automatic gain control of claim 38 wherein said evaluation unit further includes a rectifying means for obtaining the absolute value of said resultant output signal, said absolute value being applied to a an integrator effective for integrating said absolute value for a predetermined period.

54. The automatic gain control of claim 53 wherein said second delay is stored in a register and said register is further coupled to said integrator for selecting said predetermined period.

* * * * *